(12) United States Patent
Iwata

(10) Patent No.: US 7,399,688 B2
(45) Date of Patent: Jul. 15, 2008

(54) IDENTIFICATION CODE DRAWING METHOD, SUBSTRATE, DISPLAY MODULE, AND ELECTRONIC APPARATUS

(75) Inventor: Yuji Iwata, Suwa (JP)

(73) Assignee: Seiko Epson Corporation (JP)

( * ) Notice: Subject to any disclaimer, the term of this patent is extended or adjusted under 35 U.S.C. 154(b) by 134 days.

(21) Appl. No.: 11/319,083

(22) Filed: Dec. 27, 2005

(65) Prior Publication Data

US 2006/0154035 A1   Jul. 13, 2006

(30) Foreign Application Priority Data

Jan. 11, 2005   (JP)   ............................. 2005-003427

(51) Int. Cl.
*H01L 21/44* (2006.01)
*B32B 9/04* (2006.01)

(52) U.S. Cl. .................. 438/500; 428/195.1; 427/58

(58) Field of Classification Search ............... 438/500, 438/209, 20, 30, 597, 782, 195.1, 477; 427/58, 427/256, 209; 430/315; 347/20
See application file for complete search history.

(56) References Cited

U.S. PATENT DOCUMENTS

| | | | | |
|---|---|---|---|---|
| 5,821,175 | A * | 10/1998 | Engelsberg | 438/795 |
| 6,218,199 | B1 * | 4/2001 | Sato | 438/14 |
| 6,733,868 | B1 * | 5/2004 | Kanbe et al. | 428/195.1 |
| 6,861,377 | B1 | 3/2005 | Hirai et al. | |
| 7,294,155 | B2 | 11/2007 | Yudasaka | |
| 2002/0151161 | A1 * | 10/2002 | Furusawa | 438/597 |
| 2003/0232128 | A1 * | 12/2003 | Furusawa et al. | 427/58 |
| 2004/0087068 | A1 * | 5/2004 | Yudasaka | 438/149 |
| 2006/0152571 | A1 | 7/2006 | Iwata et al. | |

FOREIGN PATENT DOCUMENTS

| | | |
|---|---|---|
| CN | 1420027 | 5/2003 |
| CN | 1459824 | 12/2003 |
| CN | 1541781 | 11/2004 |
| JP | 60-036086 | 10/1994 |
| JP | 11-077340 | 3/1999 |
| JP | 2003-127537 | 5/2003 |

(Continued)

OTHER PUBLICATIONS

Park, H.K.; Grigoropoulos, C.P.; Leung, W.P.,"A Practical Excimer Laser-based Cleaning Tool for Removal of Surface Contaminants", IEEE Trans Components, Packaging, and Manufacturing Technology, part A, vol. 17, No. 4, Dec. 1994.*

*Primary Examiner*—Brook Kebede
*Assistant Examiner*—Shaka Scarlett
(74) *Attorney, Agent, or Firm*—Harness, Dickey & Pierce, P.L.C.

(57) ABSTRACT

An identification code drawing method of drawing an identification code on a substrate includes: cleaning the substrate by using a cleaning unit; performing lyophobization for the substrate; discharging liquid droplets of functional liquid, into which particles of metal or metal oxide are dispersed, from nozzles of a first liquid droplet discharging head onto a region of the substrate having been subjected to the lyophobization, on the basis of liquid droplet discharge data for drawing the identification code; and heating the liquid droplets adhered on the substrate by using a heating unit or drying the liquid droplets adhered on the substrate by using a drying unit.

8 Claims, 8 Drawing Sheets

FOREIGN PATENT DOCUMENTS

| | | |
|---|---|---|
| JP | 2003-315813 | 11/2003 |
| JP | 2004-154765 | 3/2004 |
| JP | 2006-192320 | 7/2006 |
| KR | 2003-84608 | 11/2003 |
| KR | 2004-34425 | 4/2004 |

* cited by examiner

IDENTIFICATION CODE DRAWING METHOD, SUBSTRATE, DISPLAY MODULE, AND ELECTRONIC APPARATUS

BACKGROUND

1. Technical Field

The present invention relates to an identification code drawing method, to a substrate, to a display module, and to an electronic apparatus.

2. Related Art

In the related art, in an electro-optical device such as a liquid crystal display device, an organic electroluminescent display device (organic EL display device), a plurality of electro-optical elements are formed on a substrate. In general, on this type of substrate, a unique identification code such as a barcode in which a serial number or the like is encoded for the purpose of quality and product management is drawn. The identification code is read by a dedicated code reader so as to be decoded. However, the substrate on which the identification code is formed not only goes through manufacturing processes of electro-optical elements, but also cleaning/heating processes between the manufacturing processes. Therefore, the substrate is required to be abrasion-resistant, chemically-resistant, and heat-resistant.

Due to such a problem, a method in which heat-resistant adhesive seal on which an identification code is drawn is affixed on a substrate, or a method in which an identification code is directly drawn on a substrate by irradiating a laser beam is proposed. In addition, in JP-A-2003-127537, a method in which water containing an abrasive material is jetted on a substrate so as to mark an identification code on the substrate is proposed. Further, in JP-A-11-77340, a method in which a laser beam is irradiated and a chrome-coated film is transferred onto a substrate so that a mark is formed on the substrate is proposed.

In the above-described methods, there is an advantage in that an identification code which is difficult to be removed from a substrate can be formed. However, a special or an expensive equipment such as a water jet device or a laser sputtering device is needed, which increases a cost and makes it difficult to reduce the size of the equipment. In addition, when an identification code is drawn by irradiation of a laser beam, power consumption increases. Moreover, when water, dust, or the like is adhered on a substrate during a drawing process as in a case in which the water jet device is used, the number of processes increases.

On the other hand, a device which forms the identification code on a glass substrate or the like includes a liquid droplet discharging unit (inkjet device). The liquid droplet discharging unit is a device that discharges liquid droplets containing pigment and the like from a liquid droplet discharging head onto a substrate. Also, the liquid droplet discharging unit is relatively simple and can be made small.

However, depending on liquid used in the liquid droplet discharging unit, the identification code drawn on the substrate abrades to be unclear such that the dedicated code reader cannot read the identification code. Further, as shown in FIG. 10, when liquid droplets 102 are discharged from the liquid droplet head onto a substrate 101 (refer to FIG. 10) having large wettability, there is a case in which the contact angle of the liquid droplet 102 impacted on the substrate 101 becomes small and the liquid droplet 102 spreads over even a non-discharging area where the liquid droplets 102 should not be discharged. As a result, for example, when a two-dimensional code 104 is drawn, the respective dots 103 are connected to one another by spread of liquid droplets as shown in FIG. 11, and accordingly, there is a possibility that the two-dimensional code 104 will not be read by a two-dimensional code reader.

For this reason, in order to form a dot shape, a method may be considered in which a process of discharging a liquid droplet smaller than a dot constituting an identification code onto a dot forming location is performed, a process of drying a substrate is repeatedly performed, and the liquid droplet is impacted onto the dot forming location, thereby making the dot gradually large. However, when the method is employed, the number of processes of drawing the identification code increases, so that the identification code cannot be efficiently formed.

SUMMARY

An advantage of some aspects of the invention is that it provides an identification code drawing method in which a clear identification code having high durability can be drawn on a substrate by a simple equipment, a substrate, a display module, and an electronic apparatus.

According to an aspect of the invention, an identification code drawing method of drawing an identification code on a substrate includes: cleaning the substrate by using a cleaning unit; performing lyophobization for the substrate; discharging liquid droplets of functional liquid, into which particles of metal or metal oxide are dispersed, from nozzles of a first liquid droplet discharging head onto a region of the substrate having been subjected to the lyophobization, on the basis of liquid droplet discharge data for drawing the identification code; and heating the liquid droplets adhered on the substrate by using a heating unit or drying the liquid droplets adhered on the substrate by using a drying unit.

According to the invention, when the identification code is drawn on the substrate, the substrate is cleaned by the cleaning unit. Further, the substrate is subjected to the lyophobization process. Furthermore, the liquid droplets of functional liquid, into which particles of metal or metal oxide are dispersed, are discharged from the first liquid droplet discharging head onto the region of the substrate having been subjected to the lyophobization process, on the basis of the liquid droplet discharge data for drawing the identification code. At this time, since the liquid droplets discharged from the first liquid droplet discharging head is discharged onto the region of the substrate having been subjected to the lyophobization process, the liquid droplets do not spread even though the liquid droplets are impacted on the substrate, and accordingly it is possible to maintain a suitable dot shape. Furthermore, the liquid droplets adhered to the substrate is heated or dried. Thereby, a clear identification code can be formed. Furthermore, since mediums of the liquid droplets evaporate to fix the particles made of metal or metal oxide contained in the liquid droplets on the substrate, it is possible to form, on the substrate, the identification code having higher durability than that in a case in which the identification code is drawn by using pigment or the like. In addition, since a liquid droplet discharging method in which the liquid droplets are discharged from the liquid droplet discharging head is used, it is possible to form the identification code on the substrate with a relatively simple apparatus.

In the identification code drawing method, preferably, in the lyophobization, liquid repellent agent is discharged onto the substrate by a liquid repellent agent discharging unit so as to make the substrate lyophobic.

According to the invention, since the liquid repellent agent is discharged onto the substrate by a liquid repellent agent discharging unit in the lyophobization, it is possible to make the substrate lyophobic with a relatively simple device.

Further, in the identification code drawing method, preferably, the lyophobization is performed for only a code drawing region, in which the identification code is to be drawn, of a surface of the substrate.

According to the invention, only the code drawing region, in which the identification code is to be drawn, of the surface of the substrate, is subjected to the lyophobization process. That is, since the lyophobization process does not need to be performed over a wide range of the surface of the substrate, it is possible to reduce the time spent in the lyophobization process.

Furthermore, in the identification code drawing method, preferably, in the cleaning process, only a code drawing region, in which the identification code is to be drawn, of a surface of the substrate, is cleaned.

According to the invention, only the code drawing region, in which the identification code is to be drawn, of the surface of the substrate, is cleaned. As a result, since the small region is cleaned, the time spent in the cleaning process can be reduced.

Furthermore, in the identification code drawing method, preferably, the liquid repellent agent discharging unit is a second liquid droplet discharging head having a nozzle and a piezoelectric element, and in the lyophobization, the piezoelectric element is driven to discharge liquid droplets of the liquid repellent agent from the nozzle of the second liquid droplet discharging head onto a cleaned region of the substrate.

According to the invention, the liquid repellent agent discharging unit discharges the liquid droplets of the liquid repellent agent from the nozzle onto the substrate by driving the piezoelectric element included in the second liquid droplet discharging head. That is, it is possible to precisely discharge the liquid droplets. In addition, the liquid repellent agent can be discharged with a relatively simple device.

Furthermore, in the identification code drawing method, preferably, the liquid repellent agent discharging unit is a dispenser, and in the lyophobization, the liquid repellent agent is discharged from a discharging outlet of the dispenser onto a cleaned region of the substrate.

According to the invention, the liquid repellent agent is discharged from the discharging outlet of the dispenser onto the substrate. That is, the liquid repellent agent can be discharged with a relatively simple device.

Furthermore, in the identification code drawing method, preferably, in the cleaning, a plasma generating unit cleans the substrate by using plasma generated at an atmospheric pressure.

According to the invention, in the cleaning, the plasma is generated so as to clean the substrate. Accordingly, it is possible to easily perform a partial cleaning process, for example.

Furthermore, in the identification code drawing method, preferably, in the cleaning, an ultraviolet irradiating unit irradiates ultraviolet rays so as to clean the substrate.

According to the invention, in the cleaning, the ultraviolet rays are irradiated so as to clean the substrate. Accordingly, it is possible to easily perform a partial cleaning process, for example.

Furthermore, in the identification code drawing method, preferably, in the cleaning, a laser irradiating unit irradiates laser beams so as to clean the substrate.

According to the invention, the substrate is cleaned by irradiating the laser beams. Accordingly, it is possible to easily clean only a predetermined region.

Furthermore, in the identification code drawing method, preferably, the identification code is a two-dimensional code.

According to the invention, since the identification code is a two-dimensional code, it is possible to draw a large amount of data in a small area in a coded format.

According to another aspect of the invention, a substrate includes an identification code drawn thereon. The substrate is cleaned, the substrate is subjected to lyophobization, liquid droplets of functional liquid, into which particles of metal or metal oxide are dispersed, are discharged from a liquid droplet discharging head onto a region of the substrate having been subjected to the lyophobization, on the basis of liquid droplet discharge data for drawing an identification code, the liquid droplets adhered on the substrate are heated or dried, and the particles contained in the liquid droplets adhered on the substrate are fixed on the substrate, so that the identification code is drawn.

According to the invention, the substrate used in an electronic apparatus is subjected to the cleaning and the lyophobization processes. Further, the liquid droplets of functional liquid, into which particles of metal or metal oxide are dispersed, are discharged from the liquid droplet discharging head onto the region of the substrate having been subjected to the lyophobization process on the basis of the liquid droplet discharge data for drawing the identification code. At this time, since the liquid droplets discharged from the liquid droplet discharging head is discharged onto the region of the substrate having been subjected to the lyophobization process, the liquid droplets do not spread even though the liquid droplets are impacted on the substrate, and accordingly it is possible to maintain a dot shape having a suitable contact angle. Further, the liquid droplets adhered to the substrate is heated or dried. Thereby, a clear identification code can be formed. Furthermore, since mediums of the liquid droplets evaporate to fix the particles contained in the liquid droplets on the substrate, it is possible to form, on the substrate, the identification code having higher durability than that in a case in which the identification code is drawn by using pigment or the like.

Further, according to still another aspect of the invention, a display module includes the substrate described above.

According to the invention, the display module includes the substrate in which the liquid droplets of functional liquid, into which particles of metal or metal oxide are dispersed, are discharged onto the region where the cleaning and lyophobization processes have been performed and the liquid droplets are heated or dried. That is, since the liquid droplets of functional liquid are discharged onto the region where the lyophobization process has been performed, it is possible to maintain a suitable dot shape. As a result, the display module can include the substrate on which a clear identification code having high durability is drawn.

Furthermore, according to still another aspect of the invention, an electronic apparatus includes the substrate described above.

According to the invention, the electronic apparatus includes the substrate in which the liquid droplets of functional liquid, into which particles of metal or metal oxide are dispersed, are discharged onto the region where the cleaning and lyophobization processes have been performed and the liquid droplets are heated or dried. That is, since the liquid droplets of functional liquid are discharged onto the region where the lyophobization process has been performed, it is possible to maintain a suitable dot shape. As a result, the electronic apparatus can include the substrate on which a clear identification code having high durability is drawn.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
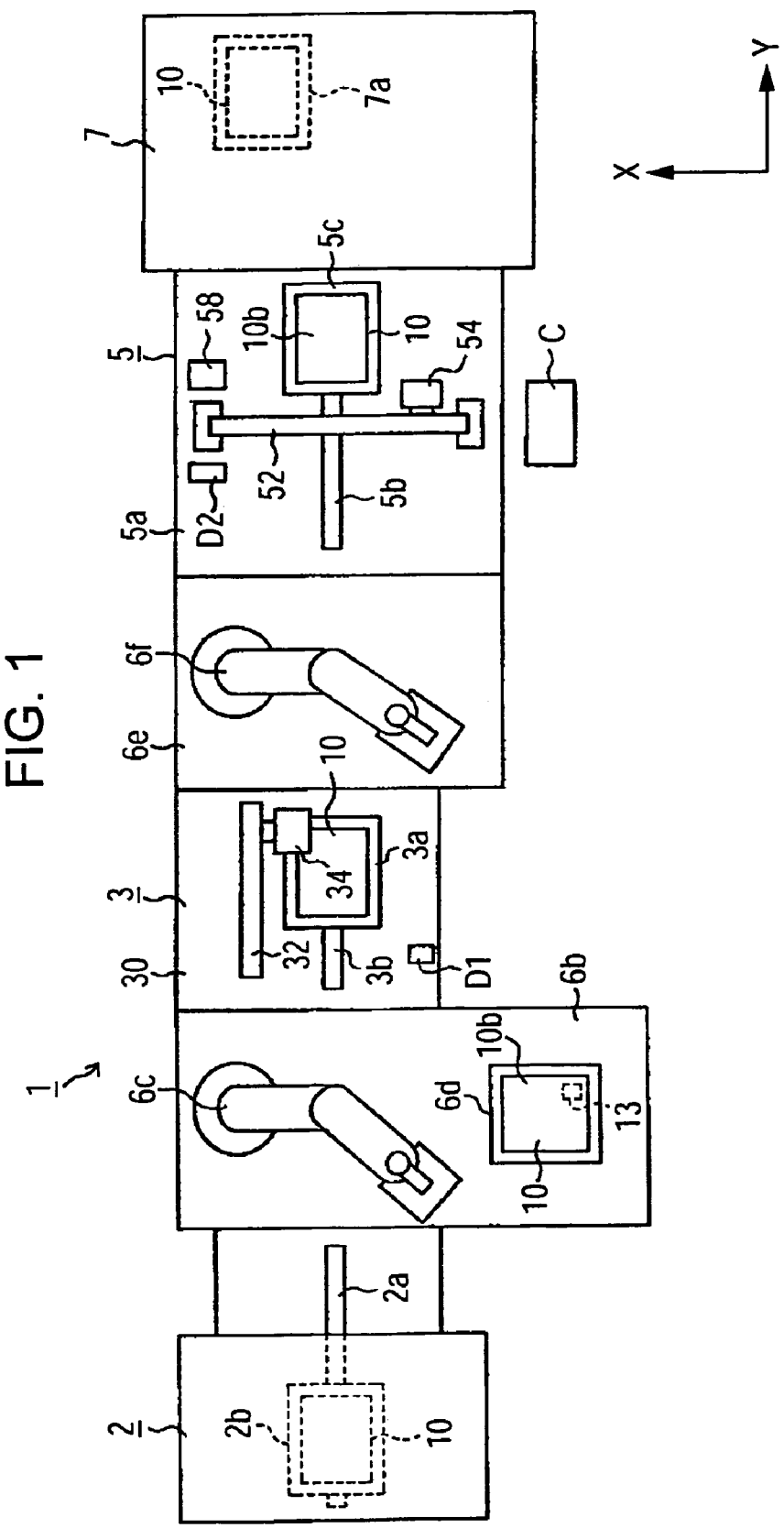
FIG. 1 is a plan view illustrating a code drawing device according to the present embodiment.

Hereinafter, an embodiment to which the invention is embodied will be described with reference to FIGS. 1 to 9. FIG. 1 is a plan view illustrating a code drawing device 1 which is used to draw a two-dimensional code, serving as an identification code, on a substrate used in a display module provided in an electronic apparatus.

As shown in FIG. 1, the code drawing device 1 includes a cleaning unit 2, a lyophobization unit 3, a liquid droplet discharging unit 5, and a heating unit 7. The cleaning unit 2 has a cleaning room (not shown) in which oxygen gas is not sealed and an electrode serving as a plasma generating unit. In addition, as a discharging from the electrode of the cleaning unit 2 occurs, plasma is generated in the cleaning room at the atmospheric pressure, and contaminated materials adhered to a back surface 10b of a glass substrate (hereinafter, simply referred to as a substrate 10) used in a display module are removed. At this time, the substrate 10 is cleaned in a state in which the substrate 10 is put on a carrying body 2b. Further, when the cleaning process is completed, the carrying body 2b moves along a carrying rail 2a extending in the Y-axis direction so as to guide the substrate 10 to a carrying arm 6c.

The carrying arm 6c is provided between the cleaning unit 2 and the lyophobization unit 3. The carrying arm 6c serves to hold the substrate 10 accommodated in a cassette 6d and to put the substrate 10 on the carrying body 2b with the back surface 10b thereof serving as a code drawing surface facing upward. Further, the carrying arm 6c takes out the substrate 10 on the carrying body 2b carried from the cleaning unit 2 and then puts the substrate 10 on a base 6b. Furthermore, the carrying arm 6c puts the substrate put on the base 6b at a predetermined position of the lyophobization unit 3.

Figure 2:
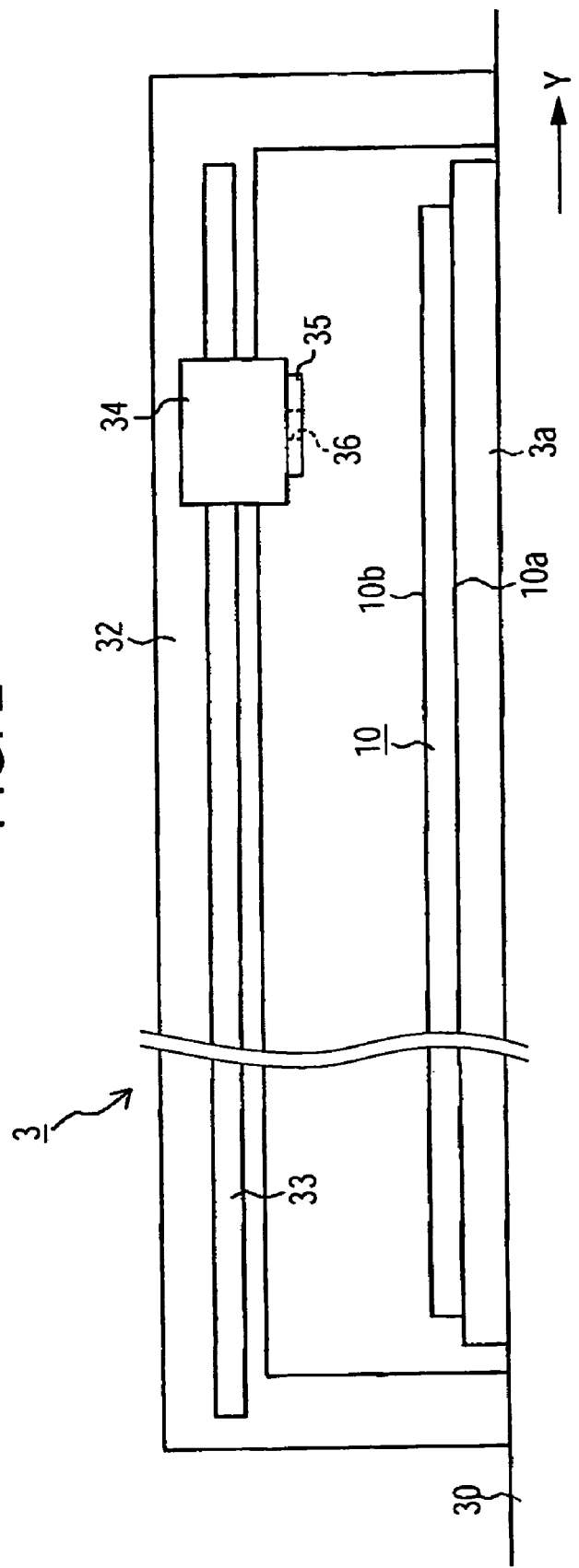
FIG. 2 is a front view illustrating a lyophobization unit included in the code drawing device.

The lyophobization unit 3 includes the carrying body 3a. The carrying body 3a is disposed on a base 30 and moves along a carrying rail 3b extending in the Y-axis direction. The cleaning-completed substrate 10 is put on the carrying body 3a by the carrying arm 6c, and the carrying body 3a carries the substrate 10 in the Y-axis direction. Next to the carrying rail 3b, a supporting portion 32 is provided to stand upright. As shown in FIG. 2, the supporting portion 32 extends in a direction parallel to the Y-axis direction and includes a guide rail 33 extending parallel to the Y-axis direction.

Further, as shown in FIG. 2, a carriage 34 is slidably provided in the guide rail 33 of the supporting portion 32. The carriage 34 can be reciprocated in the Y-axis direction along the guide rail 33 by a motor (not shown). The carriage 34 is provided with a liquid repellent agent discharging unit and a liquid repellent agent discharging head 35 serving as a second liquid droplet discharging head. The liquid repellent agent discharging head 35 includes a single or a plurality of discharging nozzles (hereinafter, referred to as a nozzle) 36. In addition, the liquid repellent agent discharging head 35 includes piezoelectric elements (not shown) corresponding to the respective nozzles 36.

When the piezoelectric elements are deformed by controlling voltages applied to the respective piezoelectric elements, the liquid repellent agent which is temporarily stored in the liquid repellent agent discharging head 35 is transformed into liquid droplets to be discharged from the nozzle 36. When a code drawing region 13 (refer to FIG. 1) provided at an edge of the substrate 10 passes immediately below the liquid repellent agent discharging head 35 by the movement of the carrying body 3a, the liquid repellent agent discharging head 35 discharges the liquid repellent agent droplets. The code drawing region 13 is set to 1 to 3 mm square, for example.

Further, the liquid repellent agent is fast-drying liquid capable of forming a liquid repellent agent film on the substrate 10. For example, the liquid repellent agent is made of a solution in which fluoroalkysilane or the like is dissolved in a fluorine-based solvent or an organic solvent. Here, when a solvent having low boiling point, such as hexane or acetone, is used as the organic solvent; the drying property is improved. The liquid droplets discharged from the liquid repellent agent discharging head 35 onto the substrate 10 do not spread, thereby forming a liquid repellent agent film in the code drawing region 13.

Furthermore, the lyophobization unit 3 includes an edge detector D1, as shown in FIG. 1. The edge detector D1 is composed of a sensor which detects the edge of the substrate 10 carried from the carrying body 3a. In addition, the lyophobization unit 3 calculates the position of the code drawing region 13 on the basis of a detection result of the edge detector D1 and then discharges the liquid repellent agent onto the code drawing region 13 by driving and controlling the liquid repellent agent discharging head 35.

Furthermore, as shown in FIG. 1, a carrying arm 6f is disposed between the lyophobization unit 3 and the liquid droplet discharging unit 5. The carrying arm 6f is provided on a base 6e, and takes out the substrate 10, on which the lyophobic droplets are coated by the lyophobization unit 3, from the carrying body 3a so as to put the substrate 10 at a predetermined location.

Next, the liquid droplet discharging unit 5 will be described. As shown in FIG. 1, the liquid droplet discharging unit 5 has a carrying rail 5b extending in the Y-axis direction with respect to a supporting base 5a. The carrying rail 5b is provided with a carrying body 5c, and the carrying body 5c can be reciprocated in the Y-axis direction along the carrying rail 5b. In addition, the carrying body 5c is put on the substrate 10 having been subjected to a lyophobization process by the carrying arm 6f and carries the substrate 10 in the Y-axis direction.

Figure 3:
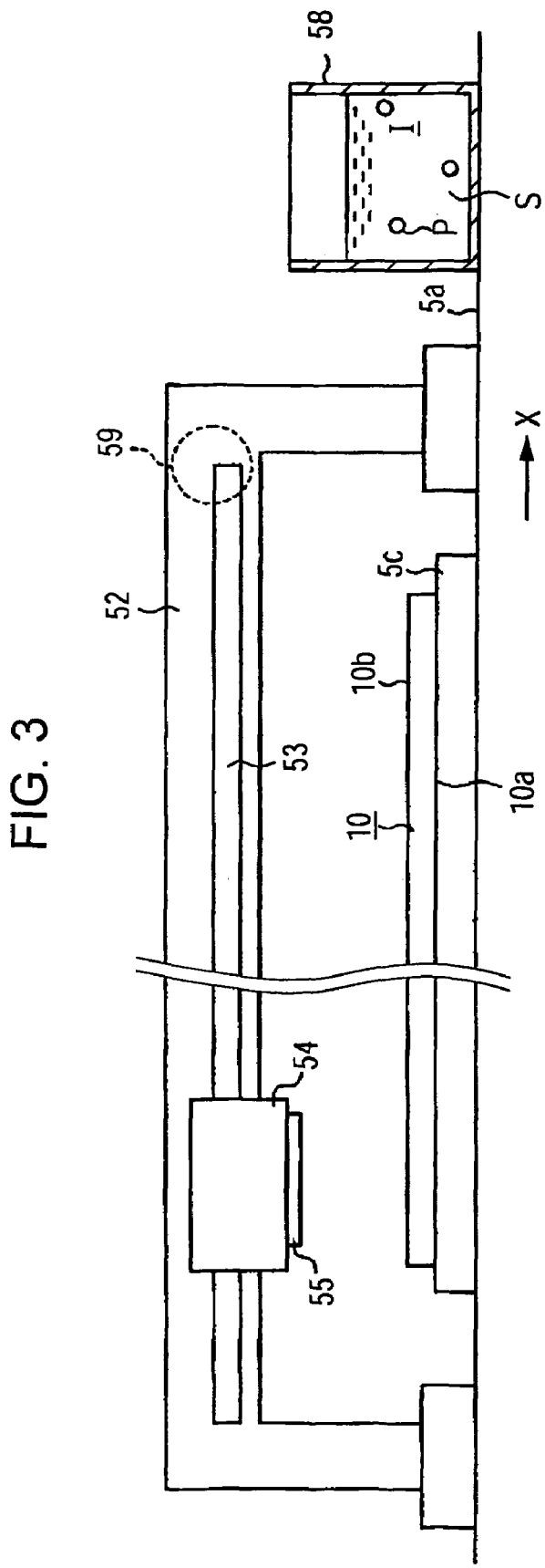
FIG. 3 is a front view illustrating a liquid droplet discharging unit included in the code drawing device.
Figure 4:
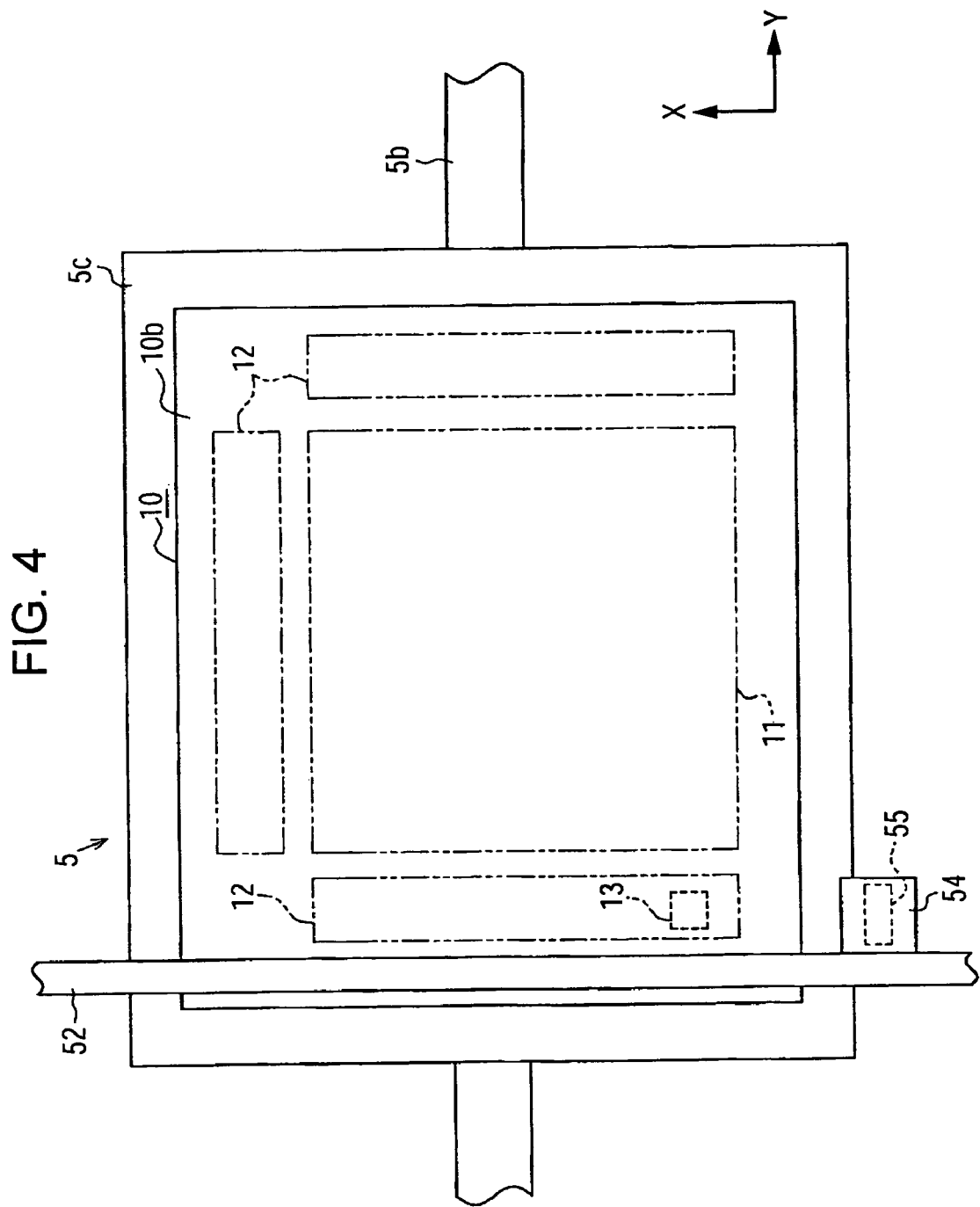
FIG. 4 is a plan view illustrating the liquid droplet discharging unit.

As shown in FIG. 4, the substrate 10 is put on the carrying body 5c with a back surface 10b thereof facing upward. At this time, the code drawing region 13 is disposed at a left end portion of FIG. 4. As shown by two-dot chain lines in FIG. 4, on the substrate 10, electro-optical elements are formed in a first region 11 of a front surface 10a (at a back side of a paper in FIG. 4, see FIG. 3), and circuit elements of a scanning line driving circuit and a data line driving circuit are respectively formed on second regions 12. Moreover, in the present embodiment, the substrate 10 before those circuit elements or electro-optical elements are formed is disposed on the carrying body 5c to be fixed.

Further, as shown in FIG. 3, a supporting portion 52 is provided to stand at the supporting base 5a. The supporting portion 52 is provided to cross above the carrying body 5c in parallel to the X-axis direction (an X arrow direction and a direction opposite to the X direction in FIGS. 1 and 3). At the supporting portion 52, a guide rail 53 extending in the X direction is disposed as shown in FIG. 3.

A carriage 54 is slidably provided in the guide rail 53. The carriage 54 can be reciprocated in the X-axis direction along the guide rail 53 by an X-axis motor 59 and an X-axis driving mechanism (not shown).

Figure 5:
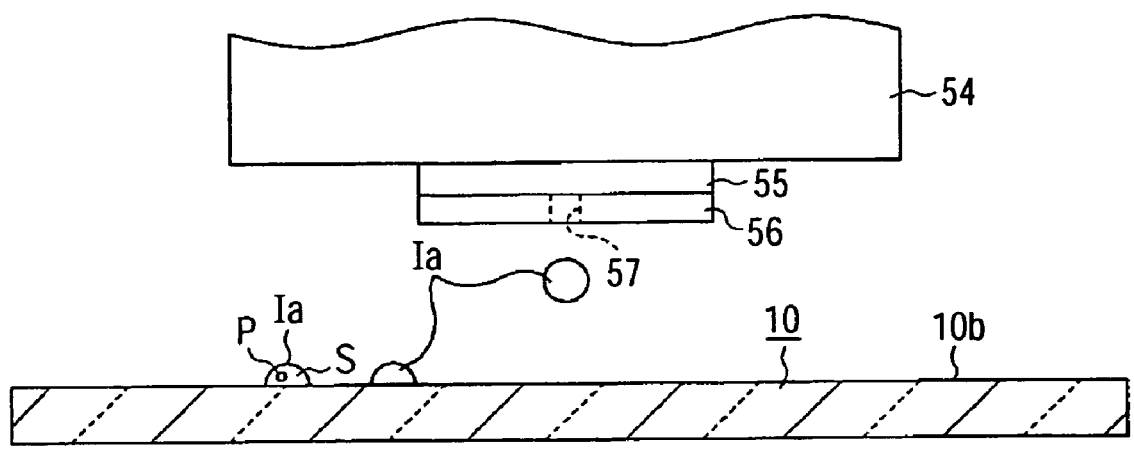
FIG. 5 is an expanded view illustrating the liquid droplet discharging unit.

Further, in the carriage 54, a liquid droplet discharging head 55 serving as a first liquid droplet discharging head is integrally provided. As shown in FIG. 5, the liquid droplet discharging head 55 includes a nozzle plate 56 on a lower surface thereof. In the present embodiment, sixteen liquid droplet discharging nozzles 57 (hereinafter, simply referred to as nozzles 57) are formed to penetrate through the nozzle plate 56, respectively. The respective nozzles 57 are formed at the same intervals so as to be arranged in a line in the Y-axis direction.

Furthermore, the liquid droplet discharging head 55 includes piezoelectric elements (not shown) corresponding to the respective nozzles 57. When the piezoelectric elements are deformed by controlling voltages applied to the respective piezoelectric elements, metallic ink I (refer to FIG. 3) serving as functional liquid which is temporarily stored in the liquid droplet discharging head 55 is transformed into liquid droplets Ia to be discharged from the nozzles 57.

In addition, as shown in FIG. 3, an ink tank 58 is connected to the carriage 54 through a supply mechanism (not shown). The ink tank 58 stores the metallic ink I therein and supplies the metallic ink I to the liquid droplet discharging head 55 through the supply mechanism. As schematically shown in FIG. 3, the metallic ink I contains dispersion medium S and metallic particles P of metal or metal oxide dispersed in the dispersion medium S.

The dispersion medium S such as water, alcohol, hydrocarbons, or the like can be discharged from the liquid droplet discharging head 55 so as to form the liquid droplets Ia having predetermined diameters. Here, the dispersion medium S may be a liquid in which the metallic particles P can be dispersed. In addition, each of the metallic particles P dispersed in the dispersion medium S is composed of a metal (or metal oxide) having a low conductivity. In the present embodiment, the metallic particles P are manganese particles. Further, it is preferable that a coating layer made of an organic material or the like be formed on the metallic particle P.

Further, as shown in FIG. 1, the liquid droplet discharging unit 5 includes an edge detector D2. The edge detector D2 is composed of a sensor which detects the edge of the substrate 10 carried from the carrying body 5c. In addition, the liquid droplet discharging unit 5 calculates the position of the code drawing region 13 on the basis of a detection result of the edge detector D2 and then discharges the ink droplets Ia (refer to FIG. 5) onto the code drawing region 13 by driving and controlling the liquid droplet discharging head 55.

The substrate 10, onto which the ink droplets Ia has been discharged by the liquid droplet discharging unit 5, is put on a hot plate 7a provided in the heating unit 7 by a carrying arm (not shown). The hot plate 7a heats the ink droplets Ia adhered to the substrate 10 and evaporates the dispersion medium S, thereby fixing the metallic particles P on the substrate 10.

The cleaning unit 2, the lyophobization unit 3, the liquid droplet discharging unit 5, and the heating unit 7 are driven and controlled by a control unit C (refer to FIG. 1). The control unit C stores a control program and an identification code (two-dimensional code) creating program in a storage unit (not shown). Based on the control program, the control unit C controls such that the cleaning unit 2, the lyophobization unit 3, the liquid droplet discharging unit 5, and the heating unit 7 continuously perform a cleaning process, a lyophobization process, a liquid droplet discharging process, and a heating process, respectively. Further, the control unit C drives the carrying arms 6c and 6f or the carrying bodies 2b, 3a, and 5c, and carries the substrate 10 by a predetermined distance in a predetermined direction.

Further, in the control unit C, bitmapped data for creating a two-dimensional code on the substrate 10 are stored beforehand. The bitmapped data is data in which identification data composed of characters and numbers such as a serial number, a lot number, and the like is two-dimensionally encoded and bitmapped by a known method.

In addition, the control unit C outputs a piezoelectric element driving signal to a driving circuit (not shown) on the basis of the bitmapped data. The driving circuit drives the piezoelectric elements to which electric power is applied in response to the piezoelectric element driving signal among the respective piezoelectric elements provided on the liquid droplet discharging head 55 of the liquid droplet discharging unit 5. Further, the droplet-like metallic ink I is discharged from the nozzles 57 corresponding to the piezoelectric elements toward the substrate 10.

Next, processes of drawing the two-dimensional code will be described. By the driving control of the control unit C, the carrying arm 6c takes out the substrate 10 from the cassette 6d and then put the substrate 10 on the carrying body 2b with the back surface 10b of the substrate 10 facing upward.

When the carrying body 2b carries the substrate 10 into the cleaning unit 2, the cleaning unit 2 starts the cleaning process. The cleaning unit 2 guides the substrate 10 to a predetermined position in the cleaning room and then generates plasma in the cleaning room by driving the electrode, thereby removing contaminated materials.

When the cleaning unit 2 completes the cleaning process, the carrying body 2b moves along the carrying rail 2a so as to carry the cleaning-completed substrate 10 to the position at which the carrying arm 6c can take out the substrate 10. The carrying arm 6c takes out the cleaning-completed substrate 10 and puts the substrate 10 on the carrying body 3a of the lyophobization unit 3.

When the substrate 10 is put on the carrying body 3a, the control unit C calculates the position of the code drawing region 13 on the basis of a detection result of the edge detector D1 and then moves the carrying body 3a along the carrying rail 3b such that the code drawing region 13 is positioned immediately below the liquid repellent agent discharging head 35. In addition, when the code drawing region 13 of the substrate 10 is carried immediately below the liquid repellent agent discharging head 35, the liquid repellent agent discharging head 35 is driven to discharge droplets of the liquid repellent agent from the nozzle 36 onto the code drawing region 13. The discharged liquid repellent agent is coated onto the code drawing region 13 of the substrate 10.

When the process of coating the liquid repellent agent is completed, the carrying body 3a moves along the carrying rail 3b to the end portion of the carrying rail 3b. In addition, the carriage 34 moves along the guide rail 33 so as to retreat from a position above the carrying body 3a. At this time, since the liquid repellent agent has a fast-drying property, a volatile component of the liquid repellent agent volatilizes to form a liquid repellent agent film on the code drawing region 13.

The carrying arm 6f takes out the substrate 10 on the carrying body 3a and then puts the substrate 10 on the carrying body 5c. As shown in FIG. 4, when the substrate 10 is disposed on the carrying body 5c, the carrying body 5c moves along the carrying rail 5b until the code drawing region 13 of the substrate 10 is disposed at the position corresponding to the Y-axis position of the liquid droplet discharging head 55. In addition, the carriage 54 moves in the X-axis direction and moves along the guide rail 33 until the liquid droplet discharging head 55 is disposed above the code drawing region 13.

In the code drawing region 13, virtual cells divided into, for example, 16 rows×16 columns, are provided. According as ink droplets of the metallic ink I are discharged or not, each of the cells becomes a white cell (non-discharged portion) to which the metallic ink I is not impacted or a black cell (discharged portion) to which the metallic ink is adhered.

At the same time, the control unit C read the bitmapped data stored in a ROM according to the code creating program. Then, the bitmapped data is converted into liquid droplet discharge data for driving the liquid droplet discharging head 55.

Figure 6:
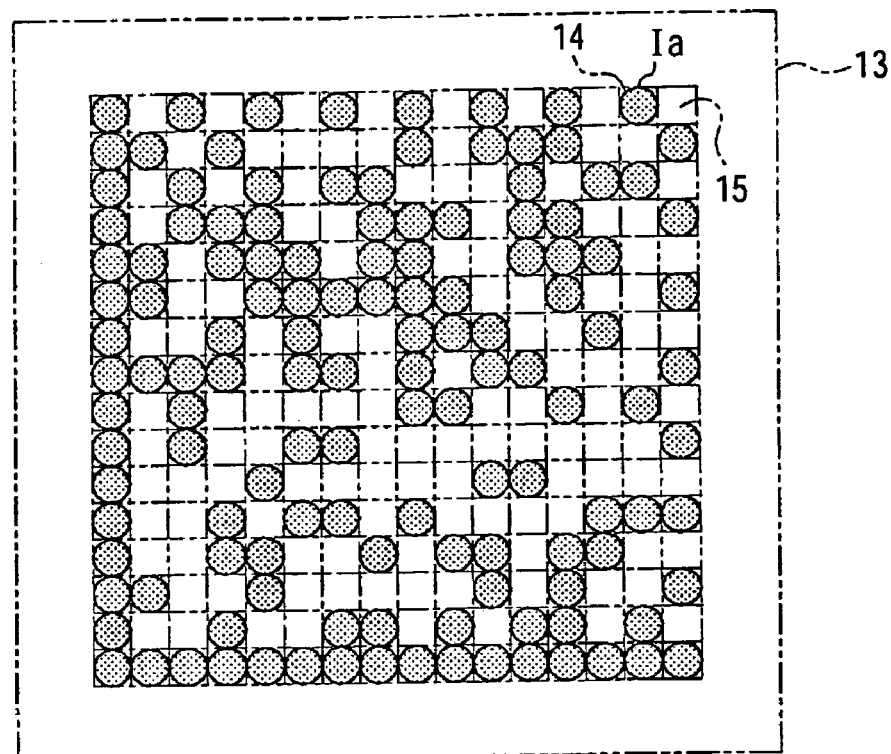
FIG. 6 is a schematic view illustrating a lyophobization region before a heating process is performed.

Further, the carriage 54 moves in the X-axis direction, and the liquid droplet discharging head 55 is driven on the basis of the created liquid droplet discharge data. That is, the liquid droplet discharging head 55 moves in the X-axis direction, and at the same time the piezoelectric elements are deformed to be driven. As a result, based on the liquid droplet discharge data, the metallic ink I is discharged from the respective nozzles 57 toward the cells which are set to black cells. A discharged ink droplet Ia adheres onto a cell to which the ink droplet is to be discharged, as shown in FIG. 6. At this time, since the ink droplet Ia is discharged onto the code drawing region 13 in which the liquid repellent agent film is formed, the ink droplet Ia does not spread, so that a hemispheric shape having a large contact angle is maintained, as shown in FIG. 5.

Further, when the liquid droplet discharging head 55 completes one-scanning operation of discharging liquid droplets, a cell 14 in which the ink droplet Ia is impacted and a cell 15 in which the ink droplet Ia is not impacted are formed in the code drawing region 13, as shown in FIG. 6. On the cell 14 in which the metallic ink I is impacted, the ink droplet Ia having a hemispheric shape is adhered. Moreover, even though a two-dimensional code according to a data matrix is shown in FIG. 5, a two-dimensional code may be formed in other forms.

When the liquid droplet discharging unit 5 completes the liquid droplet discharging process, the carrying body 5c moves along the carrying rail 5b toward the heating unit 7. The carrying arm takes out the substrate 10 on the carrying body 5c and then puts the substrate 10 on the hot plate 7a of the heating unit 7. By the hot plate 7a, the substrate 10 is heated during a predetermined period of time at a temperature where the metallic particles P can be sintered. Thereby, the dispersion medium S of the ink droplet Ia impacted in the code drawing region 13 is evaporated, and accordingly, the respective metallic particles P are fixed on the substrate 10.

Figure 7:
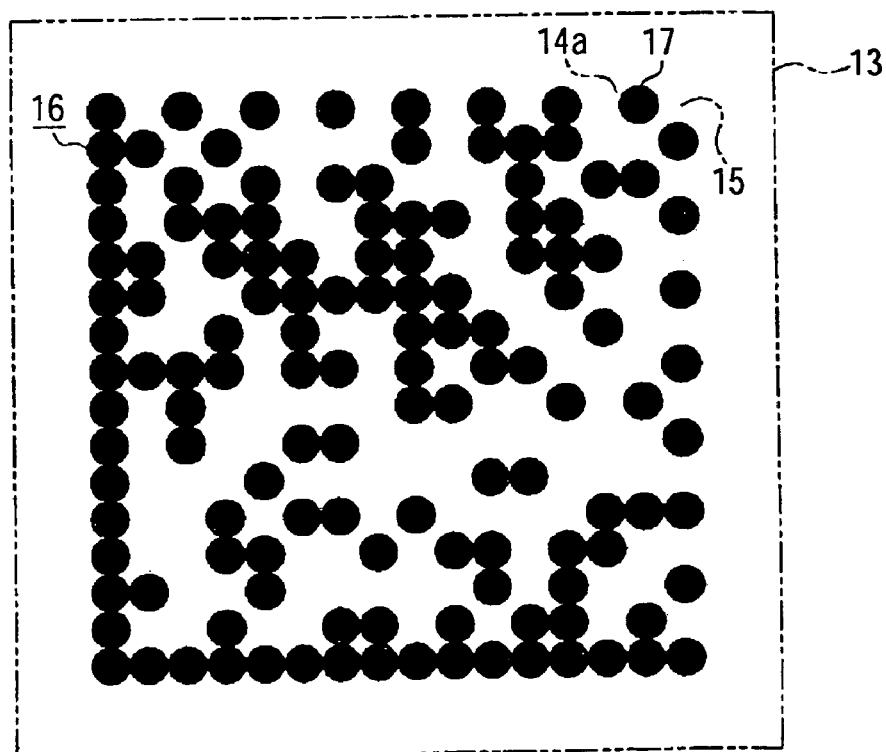
FIG. 7 is a schematic view illustrating a lyophobization region after the heating process is performed.

The metallic particles P fixed on the substrate 10 are sintered and then bonded to each other so as to be cured. As a result, as shown in FIG. 7, a two-dimensional code pattern 16 which is clear and has high durability is formed in the code drawing region 13, the two-dimensional code pattern 16 being composed of black cells 14a in which dots 17 is formed by the fixation of metallic particles P and white cells 15a in which the metallic ink I is not impacted are formed.

Figure 8:
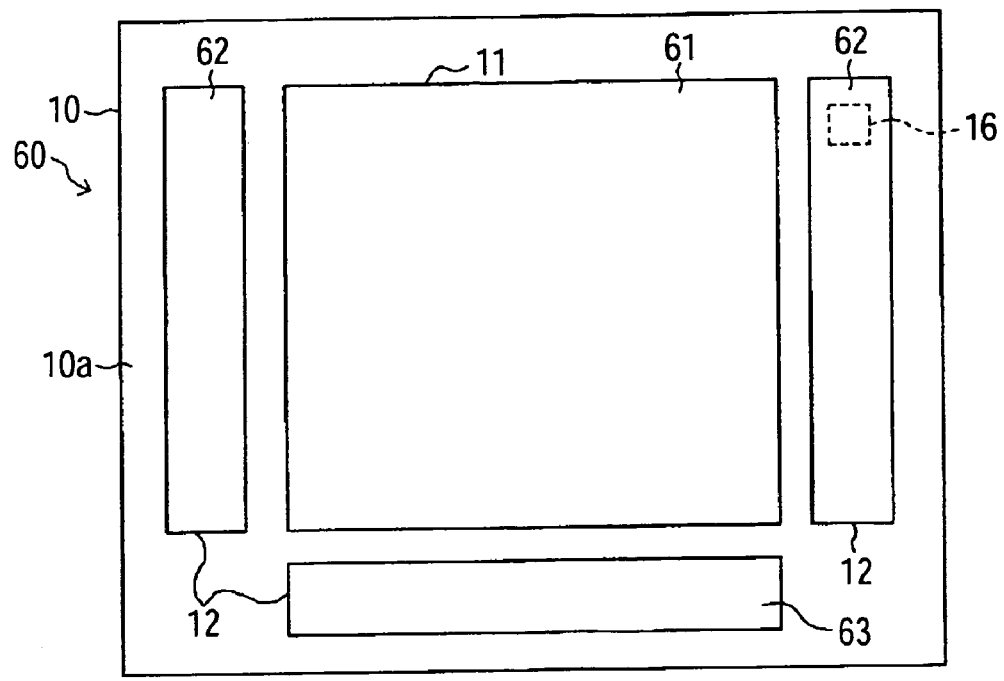
FIG. 8 is a schematic view illustrating a display module.
Figure 9:
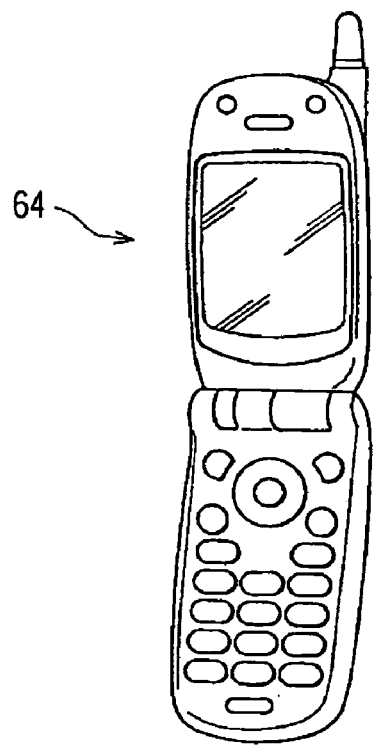
FIG. 9 is a perspective view illustrating a mobile phone including the display module.
Figure 10:
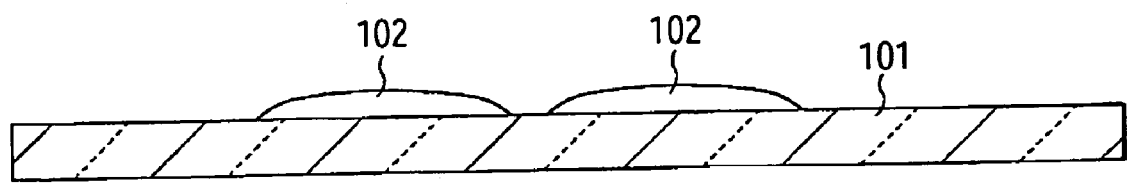
FIG. 10 is a schematic view illustrating a substrate for which a lyophobization process is not performed in the related art.
Figure 11:
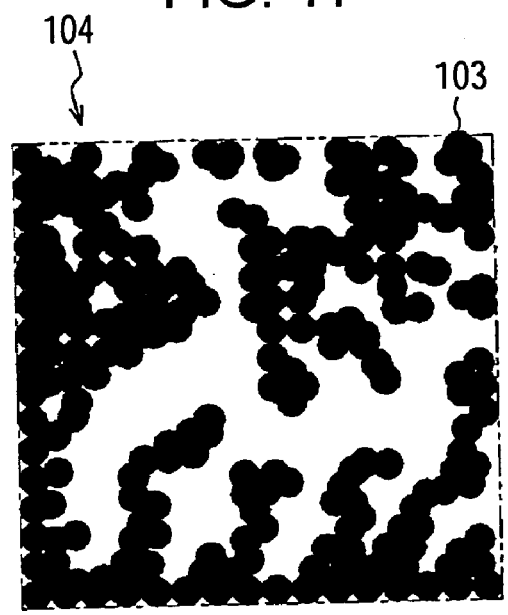
FIG. 11 is a schematic view illustrating a two-dimensional code drawn a substrate for which a lyophobization process is not performed.

The substrate 10 on which the two-dimensional code pattern 16 is formed is subjected to various processes for forming electro-optical elements and cleaning and heating processes during the various processes so as to become a display module 60 shown in FIG. 8. The display module 60 includes a display unit 61, in which liquid crystal is sealed, in the first region 11 of the substrate 10, and includes scanning line driving circuits 62 and a data line driving circuit 63 in the respective second regions 12. In FIG. 8, the two-dimensional code pattern 16 is formed on the back surface 10b of the substrate 10 on which the right-side scanning line driving circuit 62 is disposed. The two-dimensional code pattern 16 can be read by a two-dimensional code reader (not shown) provided at the back surface 10b side. In addition, the display module 60 can be used in an electronic apparatus such as a mobile phone 64 shown in FIG. 9, a mobile-type personal computer, a digital camera, or the like.

According to the above-described embodiment, the following effects can be obtained.

(1) In the above-described embodiment, in order to draw the two-dimensional code on the substrate 10 used in the display module 60, first, the cleaning unit 2 performs a cleaning process for the code drawing region 13 of the back surface 10b of the substrate 10 by using plasma generated in the cleaning room. After the cleaning process has been performed, the lyophobization unit 3 performs a lyophobization process in which the liquid repellent agent is discharged from the liquid droplet discharging head 35 and the liquid repellent agent film is formed on the code drawing region 13. After the lyophobization process has been performed, the liquid droplet discharging unit 5 performs a liquid droplet discharging process by using the metallic ink I into which the metallic particles P composed of manganese particles are dispersed. In the liquid droplet discharging process, the ink droplets Ia are discharged onto the code drawing region 13 by the liquid droplet discharging head 55 on the basis of the liquid droplet discharge data for drawing the two-dimension code. Thereby, even if the ink droplets Ia are impacted on the code drawing region 13, it is possible to maintain the dot shape having a suitable contact angle, without the ink droplets Ia spread. Further, the heating unit 7 performs a heating process in which the ink droplets Ia adhered to the substrate 10 are heated. Thereby, the dispersion medium S of the ink droplets Ia is evaporated, and thus the metallic particles P can be fixed on the substrate 10. As a result, it is possible to form the two-dimensional code pattern 16 in which the respective dots 17 are clear. Further, it is possible to form, on the substrate 10, the two-dimensional code pattern 16 having higher durability than that in a case in which the identification code (two-dimensional code) is drawn by using pigment or the like. Furthermore, since the two-dimensional code is drawn by using the liquid repellent agent discharging unit 5, it is possible to form the two-dimensional code pattern 16 with a relatively simple apparatus, and at the same time to configure the code drawing device 1 by combination of the cleaning unit 2, the lyophobization unit 3, the heating unit 7, the carrying arms 6c and 6f, and the like.

(2) In the above-described embodiment, the metallic particles P are composed of manganese particles having low conductivities. Accordingly, even though mist of the metallic ink I adheres to other devices or the like, device breakdown or the like can be prevented from occurring. In addition, even though a small amount of metallic particles P is mixed into an insulating film formed on the substrate 10 during a manufacturing process, the insulation property of the insulating film can be held.

(3) In the above-described embodiment, the liquid droplet discharging head 35 discharges the liquid repellent agent onto only the code drawing region 13 of the back surface 10b of the substrate 10. Therefore, since the liquid repellent agent is coated in a relatively small region, it is possible to reduce the time spent in the lyophobization process and to suppress the consumption amount of the liquid repellent agent.

(4) In the above-described embodiment, the cleaning unit 2 cleans only the code drawing region 13 of the back surface 10b of the substrate 10. Therefore, since the relatively small region is cleaned, the time spent in the cleaning process can be reduced.

(5) In the above-described embodiment, in the lyophobization process, the lyophobization unit 3 having the liquid droplet discharging head 35 is used, and the liquid repellent agent is discharged from the nozzle 36 of the liquid repellent agent discharging head 35 onto the code drawing region 13 of the substrate 10. Therefore, it is possible to precisely discharge the droplets and to discharge the liquid repellent agent with a relatively simple device.

(6) In the above-described embodiment, the cleaning unit 2 cleans the substrate 10 by irradiating plasma at the atmospheric pressure. Therefore, it is possible to easily clean only the code drawing region 13.

(7) In the above-described embodiment, the two-dimensional code pattern 16, serving as an identification code, is formed on the substrate 10. Therefore, it is possible to draw a large amount of data in a small area in a coded format.

Moreover, the above-described embodiment may be modified as follows.

The metallic particles P contained in the metallic ink I may be composed of one or several among manganese, nickel, silver, gold, and copper. In addition, the metallic particles P may be composed of one or several among manganese oxide, nickel oxide, silver oxide, gold oxide, and copper oxide.

Further, in the above-described embodiment, even though the supporting portion 32 of the lyophobization unit 3 is provided to be parallel to a direction (Y-axis direction) in which the substrate 10 is carried, the supporting portion 32 of the lyophobization unit 3 may be provided to be parallel to a direction (X-axis direction) perpendicular to the direction in which the substrate 10 is carried. Furthermore, in order to discharge the entire liquid repellent agent onto the code drawing region 13, the liquid repellent agent may be discharged as the liquid repellent agent discharging head 35 reciprocates along the guide rail 33 in the X-axis direction by the carriage 34. Alternatively, when the liquid repellent agent can be discharged onto the code drawing region 13 only by the movement of the carrying body 3a, the guide rail 33 provided at the supporting portion 32 may be removed.

Furthermore, in the above-described embodiment, sixteen nozzles 57 are provided in the liquid droplet discharging head 55, but the number of nozzles 57 is not limited thereto.

Furthermore, in the lyophobization process, when the liquid repellent agent which does not dry fast is used, a drying process may be performed by a drying unit or the like after the liquid repellent agent is discharged by the lyophobization unit 3.

Furthermore, in the above-described embodiment, the heating unit 7 may have a warm air furnace instead of the hot plate. Further, the heating unit 7 may temporarily dry the ink droplets Ia on the substrate 10 and solidify edges of the ink droplets Ia so as to maintain desired dot shapes. In addition, the temporarily-dried substrate 10 may be heated at a high temperature by using a separate heating unit or the heating unit 7.

Furthermore, in the above-described embodiment, when the sintering temperature of the metallic particles P of the metal ink I is low, the ink droplets Ia on the substrate 10 may be dried by the drying unit instead of the heating unit 7.

Furthermore, in the above-described embodiment, the two-dimensional code pattern 16 is drawn on the substrate 10, however, other types of identification codes, such as a simple serial number or a barcode, may be drawn on the substrate 10.

Furthermore, in the above-described embodiment, the lyophobization unit 3 may include a dispenser instead of the liquid repellent agent discharging head 35, the dispenser serving as a liquid repellent agent discharging unit and having a liquid repellent agent discharging outlet and an actuator other than the piezoelectric element.

Furthermore, in the above-described embodiment, the cleaning unit 2 may include an ultraviolet irradiating lamp serving as an ultraviolet irradiating unit so as to clean the substrate 10 by the ultraviolet ray irradiation. Alternatively, the cleaning unit 2 may include a laser device serving as a laser irradiation unit so as to remove the contaminated materials on the substrate 10 by the laser irradiation.

Furthermore, in the above-described embodiment, the liquid droplets of a solution in which fluoroalkysilane or the like is dissolved in a fluorine-based solvent or an organic solvent is discharged from the liquid repellent agent discharging head 35, however, another liquid repellent agent may be used. In addition, the lyophobization process may be performed by another method in which, for example, a plasma process is performed by using a fluorine-based gas.

The substrate 10 may be formed of a silicon wafer, a resin film, a metallic plate, or the like.

In the above-described embodiment, the display module 60 is embodied as a liquid crystal display module. However, without being limited thereto, the display module 60 may be embodied as an organic EL display module, for example. In addition, the display module 60 may be used as a display module, which includes an electron emission element having a planar shape and a field-effect display (FED, SED, or the like) using the emission of fluorescent materials by electrons emitted from the electron emission element. Moreover, the substrate 10 on which the two-dimensional code pattern 16 is drawn may be used in other electronic apparatuses, such as a printer or the like, other than the personal computer and the digital camera.

The entire disclosure of Japanese Patent Application No. 2005-003427, filed Jan. 11, 2005 is expressly incorporated by reference herein.

What is claimed is:

1. An identification code drawing method of drawing an identification code on a substrate, comprising:
cleaning the substrate by using a cleaning unit;
performing lyophobization for the substrate;
discharging liquid droplets of functional liquid, into which particles of metal or metal oxide are dispersed, from nozzles of a first liquid droplet discharging head onto a region of the substrate having been subjected to the lyophobization, on the basis of liquid droplet discharge data for drawing the identification code; and
heating the liquid droplets adhered on the substrate by using a heating unit or drying the liquid droplets adhered on the substrate by using a drying unit wherein, in the lyophobization, liquid repellent agent is discharged onto the substrate by a liquid repellent agent discharging unit so as to make the substrate be lyophobic;

the liquid repellent agent discharging unit is a second liquid droplet discharging head having a nozzle and a piezoelectric element, and in the lyophobization, the piezoelectric element is driven to discharge liquid droplets of the liquid repellent agent from the nozzle of the second liquid droplet discharging head onto a cleaned region of the substrate.

2. The method according to claim 1, wherein the lyophobization is performed for only a code drawing region, in which the identification code is to be drawn, of a surface of the substrate.

3. The method according to claim 1, wherein, in the cleaning, only a code drawing region, in which the identification code is to be drawn, of a surface of the substrate, is cleaned.

4. The method according to claim 1, wherein the liquid repellent agent discharging unit is a dispenser, and in the lyophobization, the liquid repellent agent is discharged from a discharging outlet of the dispenser onto a cleaned region of the substrate.

5. The method according to claim 1, wherein, in the cleaning, a plasma generating unit cleans the substrate by using plasma generated at an atmospheric pressure.

6. The method according to claim 1, wherein, in the cleaning, an ultraviolet irradiating unit irradiates ultraviolet rays so as to clean the substrate.

7. The method according to claim 1, wherein, in the cleaning, a laser irradiating unit irradiates laser beams so as to clean the substrate.

8. The method according to claim 1, wherein the identification code is a two-dimensional code.

* * * * *

UNITED STATES PATENT AND TRADEMARK OFFICE
CERTIFICATE OF CORRECTION

| | |
|---|---|
| PATENT NO. | : 7,399,688 B2 |
| APPLICATION NO. | : 11/319083 |
| DATED | : July 15, 2008 |
| INVENTOR(S) | : Yuji Iwata |

Page 1 of 1

It is certified that error appears in the above-identified patent and that said Letters Patent is hereby corrected as shown below:

Title Page, Item (56)
FOREIGN PATENT DOCUMENTS, "60-036086" should be -- 06-036086 --.

Signed and Sealed this

Fourteenth Day of October, 2008

JON W. DUDAS
*Director of the United States Patent and Trademark Office*